United States Patent [19]
Billman et al.

[11] 4,392,300
[45] Jul. 12, 1983

[54] APPLICATOR TOOL FOR LOOSE MINIATURE SPRING SOCKETS

[75] Inventors: Timothy B. Billman, Carlisle; Jon F. Kautz, Camp Hill, both of Pa.

[73] Assignee: AMP Incorporated, Harrisburg, Pa.

[21] Appl. No.: 313,544

[22] Filed: Oct. 22, 1981

[51] Int. Cl.³ .............................................. H05K 3/30
[52] U.S. Cl. ...................................... 29/739; 29/743; 29/758; 29/845; 227/112; 227/140; 279/3
[58] Field of Search ................. 29/739, 747, 758, 844, 29/845, 884, 743; 279/3; 173/132; 227/107, 112, 119, 140, 156

[56] References Cited

U.S. PATENT DOCUMENTS

| | | | |
|---|---|---|---|
| 2,679,713 | 6/1954 | Lytle | 279/3 |
| 3,177,952 | 4/1965 | West | 29/739 |
| 4,043,033 | 8/1977 | Yeo | 29/739 |
| 4,204,319 | 5/1980 | Bishop | 29/739 |
| 4,346,514 | 8/1982 | Makizawa et al. | 29/740 |

*Primary Examiner*—Carl E. Hall
*Attorney, Agent, or Firm*—Allan B. Osborne

[57] ABSTRACT

The present invention relates to an applicator tool capable of picking up loose miniature spring sockets and inserting them into holes in a printed circuit board. More particularly, the tool has dual air lines, one being connected to a compressed air supply and the other being connected to a vacuum. With the sockets laying on the work surface, vacuum pulls a socket into the tool nozzle. The tool is then placed into alignment with a hole and the trigger squeezed to activate the air supply to drive a ram which drives the socket out of the tool and into the hole in the board.

2 Claims, 3 Drawing Figures

APPLICATOR TOOL FOR LOOSE MINIATURE SPRING SOCKETS

BACKGROUND OF THE INVENTION

1. The Field of the Invention

This invention relates to a tool for picking up loose miniature spring sockets, one at a time, and inserting them into a hole in a printed circuit board.

2. The Prior Art

U.S. Pat. No. 4,043,033 discloses a hand held tool connected to a vibratory bowl feeder by a flexible tube. Sockets move from the feeder to the tool through the tube by means of a vacuum created by the compressed air which drives the sockets into holes in the board. The vacuum is created by the compressed air entering an annular passageway around the nozzle through which the sockets enter the tool. The air can only exhaust through the tool's outlet nozzle, thus creating the vacuum in the nozzle and attached flexible tube.

SUMMARY OF THE INVENTION

The present invention is an applicator tool for picking up a loose miniature spring socket by using vacuum and then inserting it into a hole in a printed circuit board by an air driven ram. A vacuum line and a compressed air line enter a three-way control valve in the handle of the tool. A vacuum line goes from the valve to a passageway in a ram which opens out into the outlet nozzle. The vacuum is used to pull a socket into the nozzle and hold it there. Upon aligning the nozzle with the hole in the board, the valve is activated to send compressed air into an air cylinder which drives the ram through the nozzle to insert the socket into the hole. Deactivating the valve exhausts the air cylinder so that the ram can return and another socket picked up.

DESCRIPTION OF THE INVENTION

Figure 1:
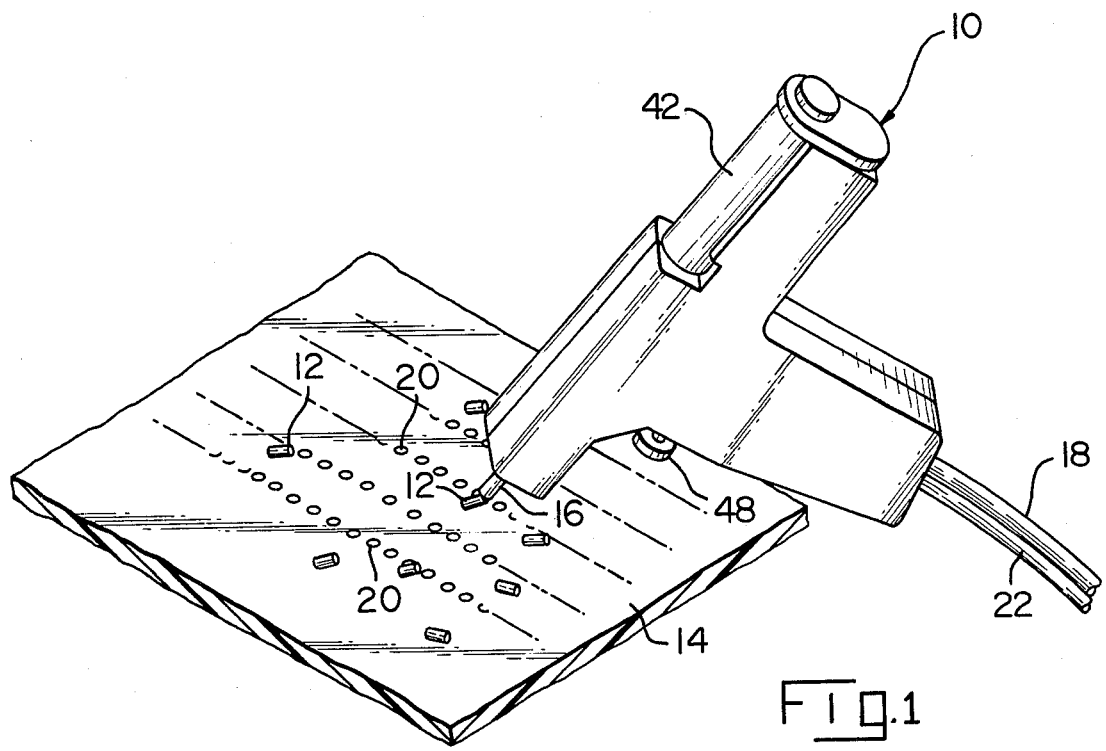
FIGS. 1 and 2 illustrate the use of the tool of the present invention in picking up a loose miniature spring socket and inserting it into a hole in a printed circuit board.

With reference to FIG. 1, pistol-shaped applicator tool 10, constructed in accordance with the concepts of the present invention, is shown picking up a conductive, miniature spring socket 12 lying loosely on top of printed circuit board (PCB) 14.

Generally, sockets 12 are cylindrical in shape, elongated and have a closed, pointed tip at the lower end. The sockets are hollow and opened at the upper end to receive a lead or pin (not shown) on an electronic package or connector. The sockets, not part of the present invention, are made and sold by a number of manufacturers; e.g., AMP Incorporated of Harrisburg, Pennsylvania.

The socket is being picked up or drawn into nozzle 16 of tool 10 by vacuum coming into the tool through flexible tube 18.

A number of other sockets are shown lying loosely on PCB 14, ready to be picked up by the tool.

The hand of the worker using the tool has been omitted for sake of clarity.

Figure 2:
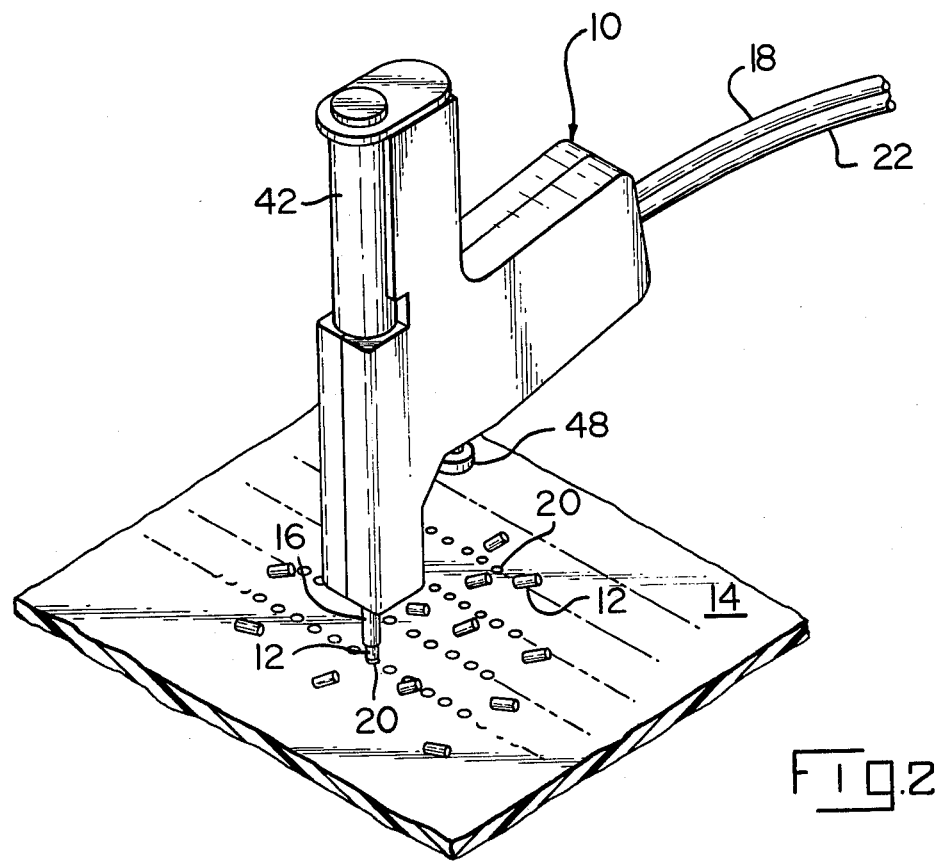

With reference to FIG. 2, applicator tool 10 is shown inserting the socket 12, which had been previously drawn into nozzle 16, into hole 20 in PCB 14.

The socket is being driven or inserted into the hole by a ram driven by compressed air coming into the tool through flexible tube 22.

As is well known, PCB 14 contains a number of holes 20 into which sockets 12 are inserted. After inserting the sockets into the holes, electronic packages, connectors, and the like can be removably plugged into the board for electrical connection to the circuits thereon (not shown) through the sockets which are generally soldered to the board.

Figure 3:
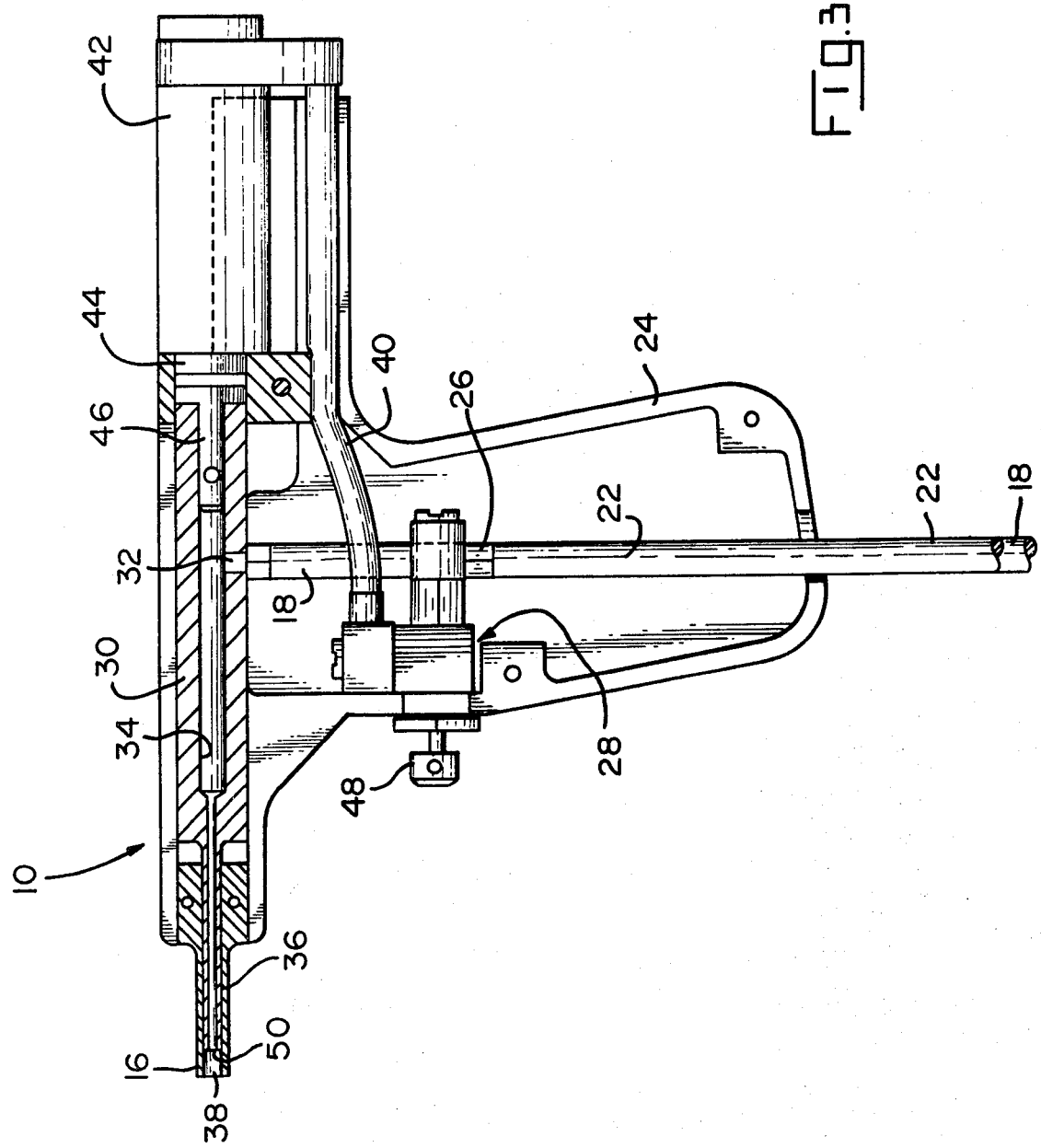
FIG. 3 is a cross-sectional view of the tool of FIGS. 1 and 2 showing the mechanism therein.

FIG. 3 is a cross-sectional drawing of tool 10 showing the mechanism which gives the tool the capability of first picking up a socket and then driving it into a hole in board 14.

Tubes 18 and 22 enter into tool 10 through an opening in the base of handle 24. Tube 22 is connected to inlet 26 on three way control valve 28. This valve is made by Clippard Instrument Laboratories, Inc. of Cincinnati, Ohio and is not part of the present invention.

Tube 18, in the embodiment shown, bypasses the valve and connects directly to a fitting on slidable ram 30. The fitting is threaded into a path 32 leading to passageway 34 in the ram. The tube has some slack so that it will not come off the fitting as the ram moves back and forth.

Passageway 34 extends through a slender cylindrical extension 36 of ram 30 and opens out into opening 38 of nozzle 16.

Tube 40 connects valve 28 to air cylinder 42 located at the rear end; i.e., opposite nozzle 16, of tool 10. The air cylinder is a conventional, well known device made and sold by Bimba Manufacturing Co. of Monee, Ill. The cylinder is secured to tool 10 conventionally. A piston 44 is moved forward by compressed air and backward by a spring (not shown) compressed during the forward travel. A stub 46 is attached to piston 44 and extends forwardly therefrom into ram 30 to which it is attached by conventional means.

Valve 28 is activated by the push button trigger 48 projecting forwardly out of handle 24.

Tool 10 functions in the following manner:

Compressed air is available in tube 22 up to valve 28 but not to air cylinder 42. Vacuum is available at opening 38 of nozzle 16 via tube 18 and passageway 34.

The worker places opening 38 next to the upper end of a socket 12. The vacuum pulls the socket into the nozzle to where the upper end abuts the free end 50 of ram extension 36. The lower end of the socket protrudes out of nozzle 16. The vacuum holds the socket in that position.

The worker now moves the tool to align nozzle 16 with a hole 20 and inserts the protruding lower end of socket 12 thereinto until the nozzle face abuts the board.

Trigger 48 is pressed to send compressed air into cylindrical 42 to drive ram 30 forwardly. The socket is thereby driven into hole 20 where an interference fit retains it therein. Upon releasing trigger 48, air is exhausted through a port (not shown) in valve 28 and ram 30 is pulled back by piston 44 under the force of the aforementioned compressed spring. Tool 10 is now ready to repeat the process.

Vacuum is continuously on, even during the movement of ram 30. Thus, the socket cannot be accidentally dislodged during the insertion step. However, the mechanism can be modified to shut off the vacuum while the ram is moving forward.

The present invention may be subject to many modifications and changes without departing from the spirit or essential characteristics thereof. The present embodiment is therefore intended in all respects as being illustrative and not restrictive of the scope of the invention.

What is claimed is:

1. An application tool for picking up a loose miniature spring socket and inserting it into a hole in a printed circuit board, the tool comprising:
   a. a frame consisting of a handle depending from a elongated perpendicular member;
   b. control means in the handle with trigger means for activating the control means;
   c. a nozzle at the forward end of the perpendicular member;
   d. a reciprocating ram mounted in the perpendicular member and extending into the nozzle;
   e. driving means to drive the ram, said means being controlled by the control means; and
   f. means to supply a vacuum to the nozzle so that a socket is drawn into the nozzle and retained there so that the ram may be driven forward by the driving means to drive the socket out of the nozzle and into a hole in a printed circuit board.

2. The tool of claim 1 wherein a passageway extends from a rear wall in the ram to the nozzle with said vacuum means being connected to the passageway.

* * * * *